(12) United States Patent
Sakai (10) Patent No.: US 7,786,502 B2
(45) Date of Patent: Aug. 31, 2010

(54) NITRIDE SEMICONDUCTOR LIGHT-EMITTING DEVICE AND METHOD OF MANUFACTURING THE SAME

(75) Inventor: Mitsuhiko Sakai, Kyoto (JP)

(73) Assignee: Rohm Co., Ltd., Kyoto-Fu (JP)

( * ) Notice: Subject to any disclaimer, the term of this patent is extended or adjusted under 35 U.S.C. 154(b) by 97 days.

(21) Appl. No.: 12/225,924

(22) PCT Filed: Apr. 12, 2007

(86) PCT No.: PCT/JP2007/058071

§ 371 (c)(1),
(2), (4) Date: Oct. 2, 2008

(87) PCT Pub. No.: WO2007/117035

PCT Pub. Date: Oct. 18, 2007

(65) Prior Publication Data

US 2009/0166663 A1 Jul. 2, 2009

(30) Foreign Application Priority Data

Apr. 12, 2006  (JP)  ............................. 2006-110279

(51) Int. Cl.
*H01L 33/00* (2010.01)
*H01L 21/00* (2006.01)
(52) U.S. Cl. .......... 257/99; 257/E33.064; 257/E31.126; 438/46; 438/609
(58) Field of Classification Search .................... 257/99, 257/E33.064, E31.126, E21.006; 438/46, 438/609
See application file for complete search history.

(56) References Cited

U.S. PATENT DOCUMENTS

| | | | |
|---|---|---|---|
| 2008/0232414 A1* | 9/2008 | Masui et al. | ............. 372/44.01 |
| 2009/0097517 A1* | 4/2009 | Sakamoto et al. | ........ 372/44.01 |

FOREIGN PATENT DOCUMENTS

| | | |
|---|---|---|
| JP | 10-135519 | 5/1998 |
| JP | 10-321912 | 12/1998 |
| JP | 2000-049376 | 2/2000 |
| JP | 2000-114595 | 4/2000 |
| JP | 2000-196197 | 7/2000 |
| JP | 2004-014943 | 1/2004 |
| JP | 2004-512688 | 4/2004 |
| JP | 2006-032889 | 2/2006 |
| WO | WO-02103813 | 12/2002 |
| WO | WO-03034508 | 4/2003 |

* cited by examiner

*Primary Examiner*—W. David Coleman
(74) *Attorney, Agent, or Firm*—Rabin & Berdo, PC (57) ABSTRACT

A nitride semiconductor light-emitting device includes, a support substrate 170; a nitride semiconductor layer 100 which includes a p-type nitride semiconductor layer 140 formed on the support substrate 170, an MQW active layer 130 formed on the p-type nitride semiconductor layer 140, and an n-type nitride semiconductor layer 120 formed on the MQW active layer 130; a contact electrode 161 formed on the n-type nitride semiconductor layer 120; a second transparent electrode 165 having an optical transparency and formed on the contact electrode 161; and a second pad electrode 166 formed on the support substrate 170 and electrically connected to the second transparent electrode 165, wherein, on a projection plane S parallel to a main surface of the MQW active layer 130, a region on which the MQW active layer 130 is projected and a region on which the second pad electrode 166 is projected are not overlapped.

5 Claims, 6 Drawing Sheets

NITRIDE SEMICONDUCTOR LIGHT-EMITTING DEVICE AND METHOD OF MANUFACTURING THE SAME

TECHNICAL FIELD

The present invention relates to a nitride semiconductor light-emitting device having a support substrate, and a method of manufacturing the same.

BACKGROUND ART

A white LED (Light Emitting Diode) in which a blue LED using a nitride semiconductor light-emitting device and a phosphor having a yellow wavelength are combined together is a product with sales of 100 billion yen all over the world as a light source of a backlight applied to a liquid-crystal display of a cell phone. In addition, the white LED has characteristics of lower power consumption and longer operating life compared to a fluorescent lamp and an incandescent lamp. Accordingly, the white LED has been actively studied and developed as an alternative light source to a fluorescent lamp and an incandescent lamp.

Figure 6:
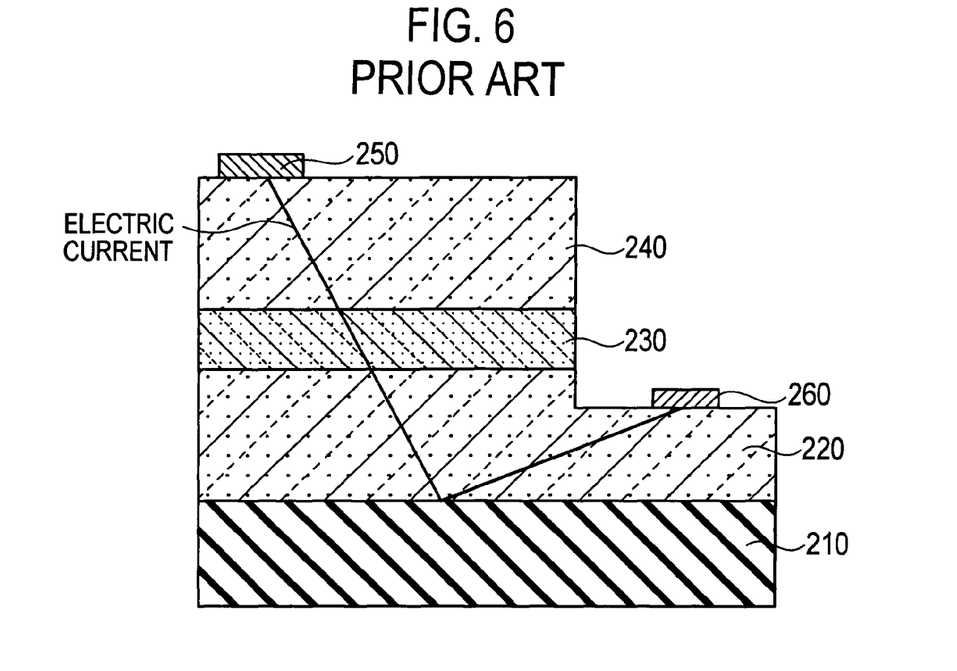
FIG. 6 illustrates a cross-sectional structure of a nitride semiconductor light-emitting device according to a prior art.

As shown in FIG. 6, a nitride semiconductor light-emitting device is configured to include an n-type nitride semiconductor layer 220, an MQW active layer 230, and a p-type nitride semiconductor layer 240 sequentially on a growth substrate 210.

This nitride semiconductor light-emitting device is a type of a nitride semiconductor light-emitting device in which light is emitted in every direction from the MQW active layer 230. For example, the nitride semiconductor light-emitting device can also be used as a flip-chip type nitride semiconductor light-emitting device in which light is emitted from the MQW active layer 230 toward the p-type nitride semiconductor layer 240, when the nitride semiconductor light-emitting device is rotated 180 degrees upside down so that the p-type nitride semiconductor layer 240 can be located on the lower side.

As the growth substrate 210, a non-conductive substrate (for example, a sapphire substrate or the like) is used. Accordingly, the nitride semiconductor light-emitting device needs to secure a pathway for the electric currents to flow through the n-type nitride semiconductor layer 220, the MQW active layer 230, and the p-type nitride semiconductor layer 240 without involving the growth substrate 210 (hereinafter, the n-type nitride semiconductor layer 220, the MQW active layer 230, and the p-type nitride semiconductor layer 240 are referred to as a nitride semiconductor layer).

To be more specific, after the nitride semiconductor layer is formed on the growth substrate 210, an etching is performed on a part of the nitride semiconductor layer from a side of the p-type nitride semiconductor layer 240, until the n-type nitride semiconductor layer 220 is exposed. Then, an n-electrode 260 is formed on the exposed surface of the n-type nitride semiconductor layer 220. Thereby, the nitride semiconductor light-emitting device is formed. This nitride semiconductor light-emitting device can secure a conduction path without involving the growth substrate 210.

However, in a conventionally used nitride semiconductor light-emitting device, the n-electrode 260 and a p-electrode 250 are formed to be located at a pair of opposing corners on the nitride semiconductor layer side of the growth substrate 210. Since the electric currents have a characteristic of flowing a shorter path under the same resistance value, there has been a problem that the electric currents are concentrated in a portion corresponding to a line drawn from the p-electrode 250 to the n-electrode 260, thereby the electric cannot be distributed evenly.

This nitride semiconductor light-emitting device also has a problem that the electric currents are concentrated in a portion corresponding to a line drawn from the p-electrode 250 to the n-electrode 260, thereby emitting light evenly from the MQW active layer 230 is difficult.

Furthermore, this nitride semiconductor light-emitting device has another problem that the voltage is concentrated in a portion corresponding to a line drawn from the p-electrode 250 to the n-electrode 260, thereby an electrostatic breakdown is tend to occur in this portion.

In order to solve the aforementioned problems, discussions have been conducted on a nitride semiconductor light-emitting device having a conductive growth substrate, and further including: a p-electrode on one end of the nitride semiconductor layer, and an n-electrode on the other end opposite to the nitride semiconductor layer, with the growth substrate interposed therebetween. However, there is a problem that the manufacturing cost of such a nitride semiconductor light-emitting device becomes high, since SiC and the like serving as the conductive growth substrate are expensive.

As a manufacturing method for solving this problem, the following manufacturing method is disclosed (for example, refer to Japanese Patent Application Publication 2004-512688). In this method, after a nitride semiconductor layer is formed on a growth substrate, and a support substrate is joined onto the nitride semiconductor layer, an excimer laser light having a wavelength of approximately 300 nm or below is irradiated at several hundred mJ/cm$^2$ onto the growth substrate side so as to thermally decompose the nitride semiconductor layer in the vicinity of the interface between the growth substrate and the nitride semiconductor layer. Thus, the nitride semiconductor layer is detached from the growth substrate 210.

Figure 7:
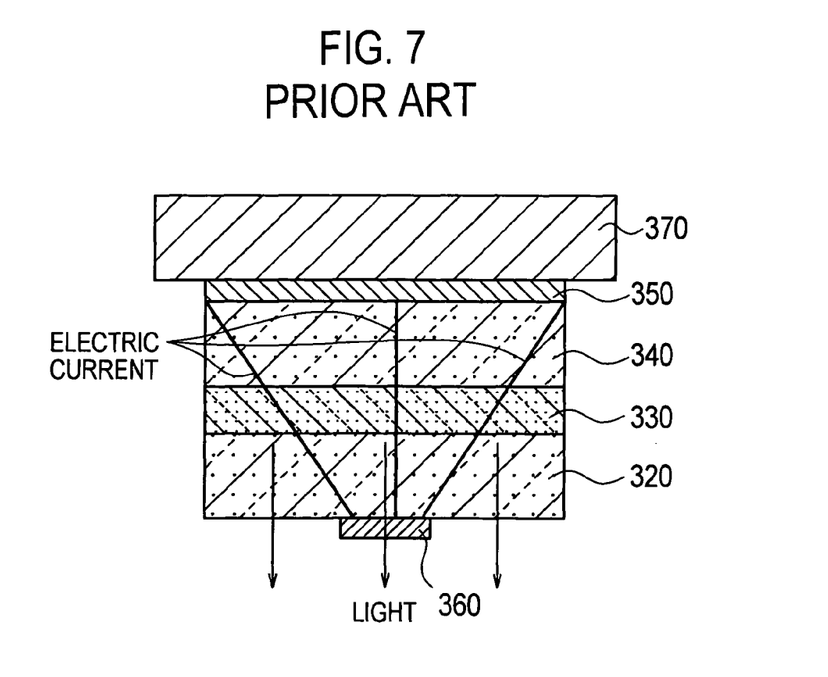
FIG. 7 is a cross-sectional structure of a nitride semiconductor light-emitting device according to a prior art.

By using such a manufacturing method, for example, a nitride semiconductor light-emitting device illustrated in FIG. 7 is prepared. This nitride semiconductor light-emitting device includes: a support substrate 370 on a p-type nitride semiconductor layer 340 side of a nitride semiconductor layer; and an n-electrode 360 on an n-type nitride semiconductor layer 320. The n-electrode 360 is connected to a wire, and supplies electrons to the n-type nitride semiconductor layer 320.

In this nitride semiconductor light-emitting device, the support substrate 370 functions as a p-electrode, and allows electron holes to flow across the entire surface of the p-type nitride semiconductor layer 340. Accordingly, uniformity of the electric currents to flow through the nitride semiconductor light-emitting device is improved.

Furthermore, since a reflecting mirror film 350 is provided between the support substrate 370 and the nitride semiconductor layer, the nitride semiconductor light-emitting device can emit a large amount of light from an MQW active layer 330 toward the n-type nitride semiconductor layer 320.

In the meantime, the nitride semiconductor light-emitting device includes the n-electrode 360 made of metal. This is because the optically-transparent electrode cannot be in ohmic contact with the n-type nitride semiconductor layer 320 if an optically-transparent electrode, such as ZnO and ITO, is used as the n-electrode 360 in the nitride semiconductor light-emitting device.

DISCLOSURE OF THE INVENTION

However, in the aforementioned nitride semiconductor light-emitting device, the n-electrode 360 is a pad electrode connected to a wire, and a positional adjustment is required in the wire bonding. Accordingly, the diameter of the n-electrode 360 is larger than a predetermined size (for example, 100 μm). Moreover, since the n-electrode 360 does not have an optical transparency, the n-electrode 360 absorbs light emitted from the MQW active layer 330 toward the n-type nitride semiconductor layer 320. As a result, the amount of light emitted from the nitride semiconductor light-emitting device decreases in accordance with the area ratio of the n-electrode 360 to the surface of the n-type nitride semiconductor layer.

In other words, there has been a problem that the light extraction efficiency of the nitride semiconductor light-emitting device is decreased.

Therefore, the present invention has an object of providing a nitride semiconductor light-emitting device and a method of manufacturing the same, which can improve the light extraction efficiency of the nitride semiconductor light-emitting device.

An aspect of the present invention is summarized as a nitride semiconductor light-emitting device, including: a support substrate; a nitride semiconductor layer which includes a p-type nitride semiconductor layer formed on the support substrate, an active layer formed on the p-type nitride semiconductor layer, and an n-type nitride semiconductor layer formed on the active layer; a contact electrode formed on the n-type nitride semiconductor layer; a transparent electrode having an optical transparency and formed on the contact electrode; and a pad electrode formed on the support substrate and electrically connected to the transparent electrode, wherein, on a projection plane parallel to a main surface of the active layer, a region on which the active layer is projected and a region on which the pad electrode is projected are not overlapped.

According to this aspect, the region on which the active layer is projected and the region on which the pad electrode is projected are not overlapped, on the projection plane parallel to the main surface of the active layer. As a result, light generated in the active layer and emitted from the active layer toward the n-type nitride semiconductor layer can be emitted from the nitride semiconductor light-emitting device without being absorbed by the pad electrode. Therefore, it is possible to obtain a nitride semiconductor light-emitting device capable of improving the light extraction efficiency, compared to a nitride semiconductor light-emitting device having the pad electrode on the surface of the n-type nitride semiconductor layer.

Since the contact electrode is formed on the n-type nitride semiconductor layer, the contact electrode can supply electrons to the n-type nitride semiconductor layer. In other words, the contact electrode can be in ohmic contact with the n-type nitride semiconductor layer.

In the aspect of the nitride semiconductor light-emitting device of this embodiment, an area of a region on which the contact electrode is projected can be smaller than an area of a region on which the pad electrode is projected, on the projection plane.

According to this aspect, on the projection plane, the area of the contact electrode can be made smaller than the area of the pad electrode joined to the wire. Therefore, it is possible to improve the light extraction efficiency compared to a nitride semiconductor light-emitting device having the pad electrode on the surface of the n-type nitride semiconductor layer.

In the aspect of the nitride semiconductor light-emitting device of this embodiment, the transparent electrode may be extendedly formed along a side surface of the nitride semiconductor layer, and an insulating film may be provided between the transparent electrode and the side surface of the nitride semiconductor layer.

According to this aspect, since the insulating film is provided between the transparent electrode and the side surface of the nitride semiconductor layer, the electric currents can be prevented from leaking into the nitride semiconductor layer (the active layer and the p-type nitride semiconductor layer).

An aspect of the present invention is summarized as a method of manufacturing a nitride semiconductor light-emitting device, including: forming, on a growth substrate, a nitride semiconductor layer made of an n-type nitride semiconductor layer, an active layer, and a p-type nitride semiconductor layer sequentially, joining a support substrate onto the p-type nitride semiconductor layer, detaching the n-type nitride semiconductor layer from the growth substrate, forming a contact electrode on the n-type nitride semiconductor layer exposed by the detachment of the growth substrate; forming, on the contact electrode, a transparent electrode having an optical transparency; and forming, on the support substrate, a pad electrode electrically connected to the transparent electrode, wherein the pad electrode is formed so that a region on which the main surface of the active layer is projected and a region on which the pad electrode is projected are not overlapped, on a projection plane parallel to a main surface of the active layer.

According to this aspect, it is possible to obtain a nitride semiconductor light-emitting device capable of improving the light extraction efficiency compared to a nitride semiconductor light-emitting device having the pad electrode on the surface of the n-type nitride semiconductor layer.

BEST MODE FOR CARRYING OUT THE INVENTION

Next, an embodiment of the present invention will be described by referring to the drawings. Here, the same or similar reference numerals are applied to the same or similar portions in the following descriptions of the drawings. However, note that, since the drawings are schematic, ratios of respective dimensions, and the like are different from the actual ones.

Therefore, concrete dimensions and the like are to be determined in consideration of the following descriptions. In addition, it is obvious that the drawings include portions having different relationships in dimensions or ratios.

(Configuration of a Nitride Semiconductor Light-Emitting Device According to an Embodiment of the Present Invention)

Figure 1:
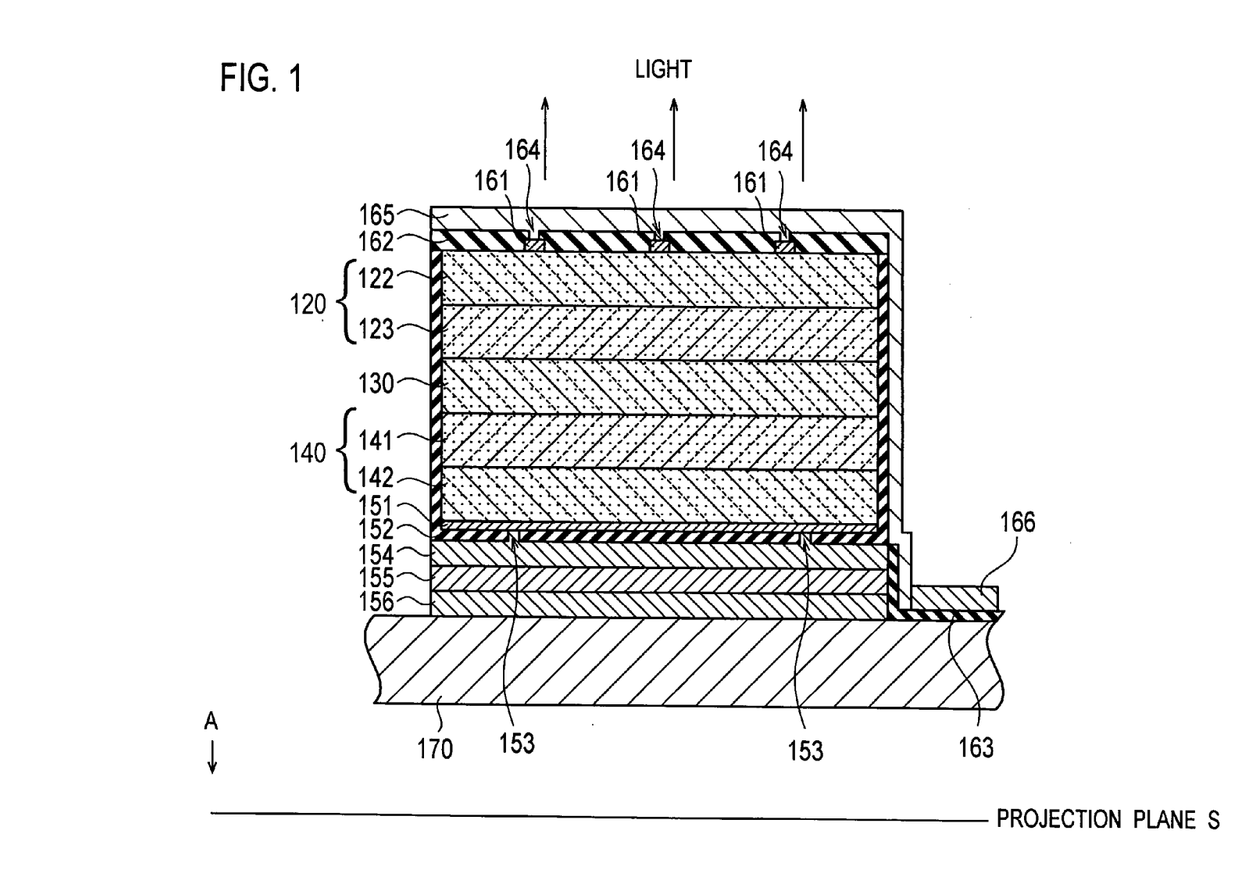
FIG. 1 is a view illustrating a cross-sectional structure of a nitride semiconductor light-emitting device according to an embodiment of the present invention.

By referring to FIG. 1 and FIG. 2, a nitride semiconductor light-emitting device according to an embodiment of the present invention will be described. FIG. 1 illustrates a cross-sectional structure of a nitride semiconductor light-emitting device of an embodiment of the present invention.

The nitride semiconductor light-emitting device of the embodiment of the present invention includes a nitride semiconductor layer 100 which has a structure in which a p-type nitride semiconductor layer 140, an MQW active layer 130, and an n-type nitride semiconductor layer 120 are formed sequentially on a support substrate 170. The nitride semiconductor light-emitting device includes: a contact electrode 161 formed on the n-type nitride semiconductor layer 120; a second transparent electrode 165 having an optical transparency and formed on the n contact electrode 161; a second pad electrode 166 formed on the support substrate 170 and electrically connected to the second transparent electrode 165.

Further description will be given for the components constituting this nitride semiconductor light-emitting device.

The n-type nitride semiconductor layer 120 has a structure in which an n-type superlattice layer 123 and an n-type contact layer 122 are sequentially formed.

The n-type contact layer 122 is made of Si-doped GaN. Here, the n-type contact layer 122 is in ohmic contact with the contact electrode 161.

The n-type superlattice layer 123 has a superlattice structure in which an InGaN layer made of Si-doped InGaN and a GaN layer made of Si-doped GaN are alternately laminated respectively.

The MQW active layer 130 has an MQW (Multi Quantum Well) structure formed by a nitride semiconductor containing In.

For example, the MQW active layer 130 has an MQW structure in which a well layer made of $In_{0.17}GaN$ having a thickness of 3 nm and a barrier layer made of undoped GaN having a thickness of 10 nm are alternately laminated eight times, respectively.

The p-type nitride semiconductor layer 140 has a structure in which a p-type contact layer 142 and a p-type clad layer 141 are sequentially formed.

The p-type clad layer 141 is made of undoped GaN or $In_{0.01}GaN$ containing approximately 1% In.

The p-type contact layer 142 is made of Mg-doped GaN. Note that the p-type contact layer 142 is in ohmic contact with a first transparent electrode 151.

The nitride-semiconductor light emitting device includes a first insulating film 152 made of SiN, $SiO_2$, SiON, $Al_2O_3$, and the like. The first insulating film 152 is provided on a side surface 100B of the nitride semiconductor layer 100 including the layers from the n-type contact layer 122 to the p-type contact layer 142, on a side surface of the first transparent electrode 151 and a reflecting mirror film 154. The first insulating film 152 includes a first contact hole 153 so as to bring the first transparent electrode 151 and the reflecting mirror film 154 into contact with each other while the first insulating film 152 is interposed therebetween.

This nitride semiconductor light-emitting device includes the reflecting mirror film 154, a first joining layer 155, and a second joining layer 156 sequentially from a side of the first insulating film 152, between the support substrate 170 and the first insulating film 152.

The reflecting mirror film 154 contacts with the first transparent electrode 151 via the first contact hole 153, thereby securing a pathway allowing electric currents to flow into the first transparent electrode 151. The reflecting mirror film 154 is a conductive metal layer having a structure in which an Al layer, a Ti layer, and an Au layer are formed sequentially from a surface side of the first insulating film 152. The first insulating film 152 is formed on a surface of the first transparent electrode 151.

Here, the reflecting mirror layer 154 may be made of a silver-white conductive metal layer, for example, an Ag layer or the like, instead of an Al layer. Furthermore, the reflecting mirror layer 154 may be made of, instead of an Au layer, an alloy layer of Au and Sn. Moreover, the reflecting mirror layer 154 may have an Au layer formed on an Al layer, without a Ti layer. A silver-white conductive metal layer such as an Al layer reflects light emitted from the p-type contact layer 142. Therefore, an extraction efficiency of light taken from the n-type contact layer 122 can be improved.

The first joining layer 155 is made of an Au layer alone or an alloy layer of Au and Sn, formed sequentially from a surface side of the reflecting mirror film 154.

The second joining layer 156 is joined to the first joining layer 155, and is made of an Au layer alone or an alloy layer of Au and Sn as similar to the first joining layer 155.

This nitride semiconductor light-emitting device includes the contact electrode 161 formed on the n-type nitride semiconductor layer 120.

The contact electrode 161 is an electrode having a structure in which a Ti layer and an Al layer are formed sequentially from a surface side of the n-type contact layer 122. Note that the contact electrode 161 may be made of an Al layer alone without a Ti layer. The contact electrode 161 is in ohmic contact with the n-type contact layer 122.

Furthermore, the nitride semiconductor light-emitting device includes a second insulating film 162 provided on a surface of the n-type contact layer and a part of a surface of the contact electrode 161. The second insulating film 162 is made of SiN, $SiO_2$, SiON, $Al_2O_3$, and the like. The second insulating film 162 includes a second contact hole 164 so as to bring the second transparent electrode 165 and the contact electrode 161 into ohmic contact with each other, while the second insulating film 162 is interposed therebetween.

This nitride semiconductor light-emitting device includes the second transparent electrode 165 having an optical transparency and formed on the contact electrode 161. To be more specific, the second transparent electrode 165 is formed on the surface of the contact electrode 161 exposed via the second contact hole 164, and on a surface of the second insulating film 162. Moreover, the second transparent electrode 165 is extendedly formed on a surface of a third insulating film 163 and on a part of the surface of the first insulating film 152. Here, the part of the surface of the first insulating film 152 is referred to the portion formed on the side surface 100B of the nitride semiconductor layer 100 provided between the contact electrode 161 and the second pad electrode 166. Further, the second transparent electrode 165 is made of Ga-doped ZnO, ITO, and the like on a surface of the second insulating film 162, and is in ohmic contact with the contact electrode 161 through the second contact hole 164 provided between the second insulating film 162. Moreover, the second transparent electrode 165 is formed on a side surface of the nitride semiconductor layer while having the first insulating film 152 interposed therebetween. The second transparent electrode 165 is joined to the second pad electrode 166.

The nitride semiconductor light-emitting device includes the second pad electrode 166 formed on the support substrate 170 and electrically connected to the second transparent electrode 165. To be more specific, the second pad electrode 166 is provided on the support substrate 170 while having the third insulating film 163 interposed therebetween, and is connected to the second transparent electrode 165.

The support substrate 170 is bonded to the nitride semiconductor layer while having the first joining layer 155 and the second joining layer 156 interposed therebetween. The support substrate 170 is made of a high thermal conductive material, such as Cu, AlN, or the like.

By referring to FIG. 2, further descriptions will be given for a pad electrode which supplies electric currents to the nitride semiconductor layer and which is joined to a wire. FIG. 2 is a projection view obtained by projecting, from a direction A, the nitride semiconductor light-emitting device according to the embodiment of the present invention illustrated in FIG. 1, and is a view illustrating a projection plane S parallel to the main surface of the MQW active layer 130. Note that components other than the first pad electrode 157, the contact electrode 161, the second transparent electrode 165, the second pad electrode 166, the third insulating film 163, and the support substrate 170 are omitted in FIG. 2.

Figure 2:
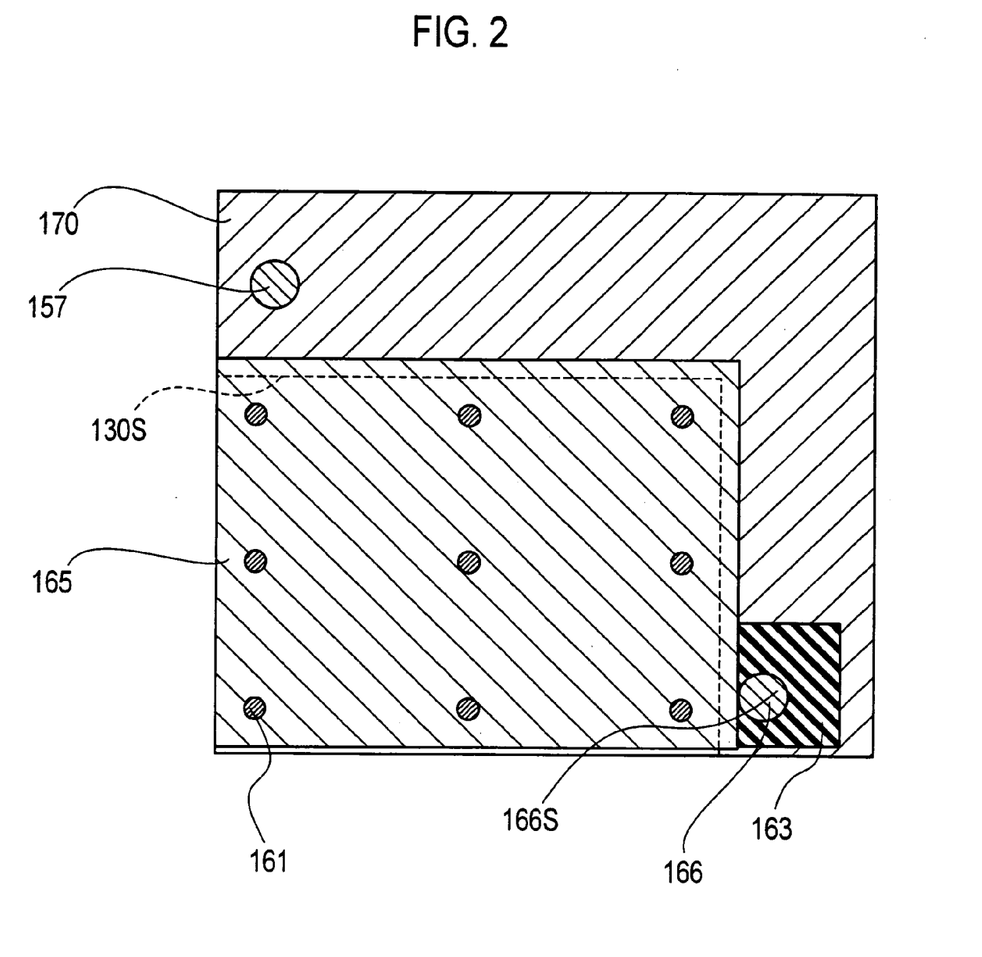
FIG. 2 is a view illustrating an A cross-sectional view of the nitride semiconductor light-emitting device according to the embodiment of the present invention.

As shown in FIG. 2, on the projection plane S parallel to the main surface of the MQW active layer 130, a region 130S on which the MQW active layer 130 is projected and a region 166S on which the second pad electrode 166 is projected are not overlapped.

To be more specific, the second electrode 166 is not provided in the region 130S on which the MQW active layer 130 is projected. However, the second electrode 166 is provided on a surface of the third insulating film 163 which insulates the second electrode 166 from the support substrate 170, and is joined to the second transparent electrode 165. The second pad electrode 166 supplies electric currents to the nitride semiconductor layer via the second transparent electrode 165 and the contact electrode 161. The diameter of the second pad electrode 166 is 100 µm or above, for example.

The first pad electrode 157 is formed in any region on a surface of the support substrate 170. The first pad electrode 157 supplies electric currents to the nitride semiconductor layer through: the support substrate 170, the second joining layer 156, the first joining layer 155, the reflecting mirror film 154, and the first transparent electrode 151.

The first pad electrode 157 and the second pad electrode 166 are electrodes each having a structure in which a Ti layer and an Al layer are formed sequentially from a surface side of the support substrate 170.

(A Method of Manufacturing a Nitride Semiconductor Light-Emitting Device according to the first embodiment of the present invention)

Hereinafter, steps performed in a method of manufacturing a nitride semiconductor light-emitting device of the present embodiment will be described by referring to FIG. 3 to FIG. 5.

Figure 3:
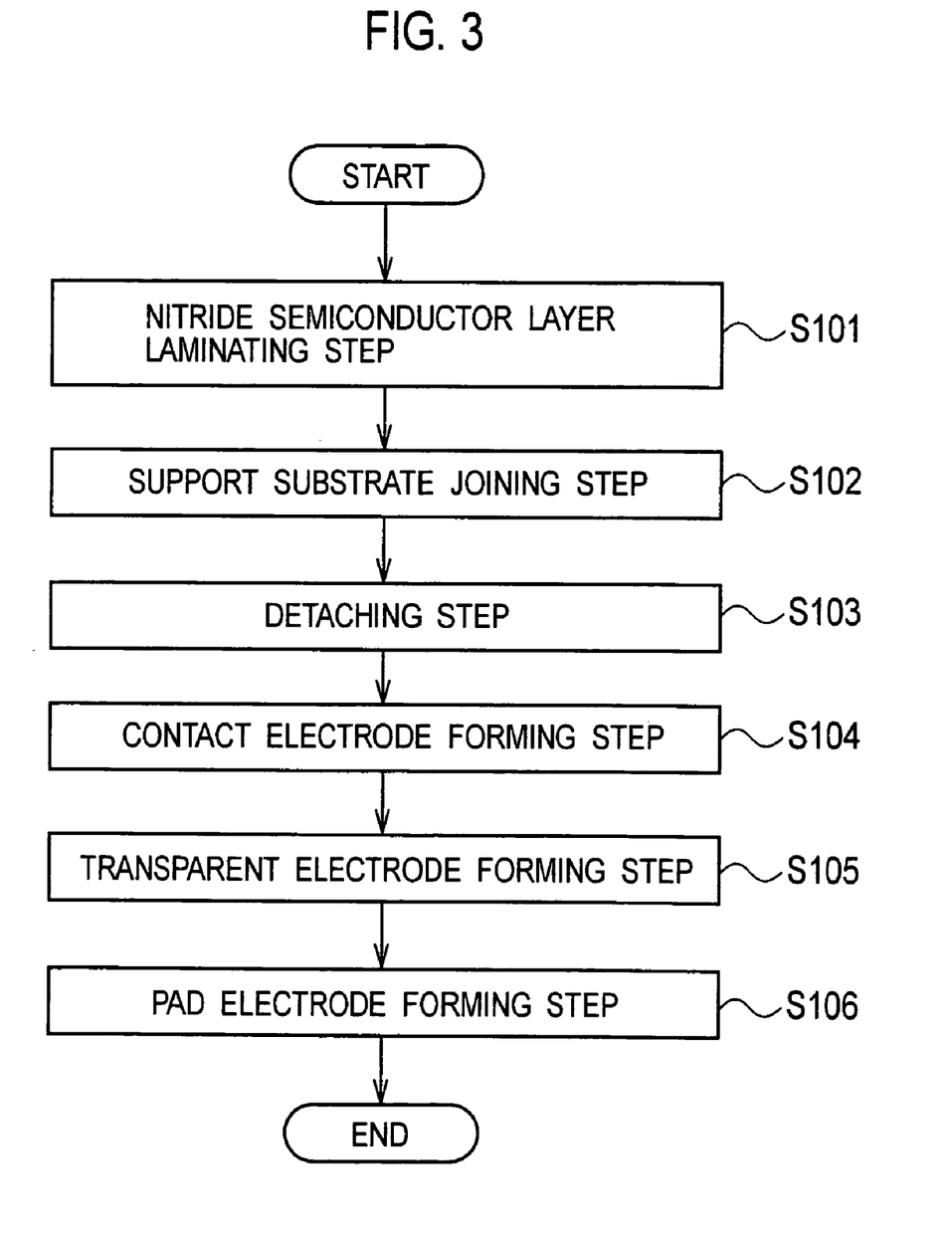
FIG. 3 shows a manufacturing flow of a method of manufacturing a nitride semiconductor light-emitting device according to an embodiment of the present invention.

As shown in FIG. 3, in Step S101, a laminating step is performed in which a nitride semiconductor layer is formed on a growth substrate 110 made of sapphire.

To be more specific, in the laminating step, the growth substrate 110 is firstly placed in a MOCVD (Metal Organic Chemical Vapor Deposition) device, and a thermal cleaning is performed on the growth substrate 110 by increasing the temperature to approximately 1050° C. while causing hydrogen gas to flow.

Secondly, the temperature in the MOCVD device is reduced to approximately 600° C., to form an n-type buffer layer 121 by a crystal growth on the growth substrate 110 by using an epitaxial growth (hereinafter referred to simply as crystal growth).

Thirdly, the temperature in the MOCVD device is increased again to approximately 1000° C., to form the n-type contact layer 122 made of Si-doped GaN by a crystal growth, on the n-type buffer layer 121.

Fourthly, an n-type superlattice layer 123 having a superlattice structure is formed by a crystal growth on the n-type contact layer 122, by alternately laminating an InGaN layer made of Si-doped InGaN and a GaN layer made of Si-doped GaN, respectively.

Fifthly, on the n-type superlattice layer 123, a well layer made of $In_{0.17}GaN$ having a thickness of 3 nm and a barrier layer made of undoped GaN having a thickness of 10 nm are alternately laminated eight times, respectively, to form the MQW active layer 130 by a crystal growth.

Sixthly, on the MQW layer 130, a p-type clad layer 141 is formed by a crystal growth. The p-type clad layer 141 is made of an undoped GaN layer or an InGaN layer containing approximately 1% In.

Seventhly, while further increasing the temperature inside the MOCVD device, a p-type contact layer 142 made of Mg-doped GaN is formed on the p-type clad layer 141 by a crystal growth. Thus, a nitride semiconductor layer is formed.

Eighthly, on the p-type contact layer 142, by using a molecular beam epitaxy method, a first transparent electrode 151 made of Ga-doped ZnO, ITO, and the like having a low resistivity of approximately $2 \times 10^{-4}$ Ω·cm is formed.

Figure 4:
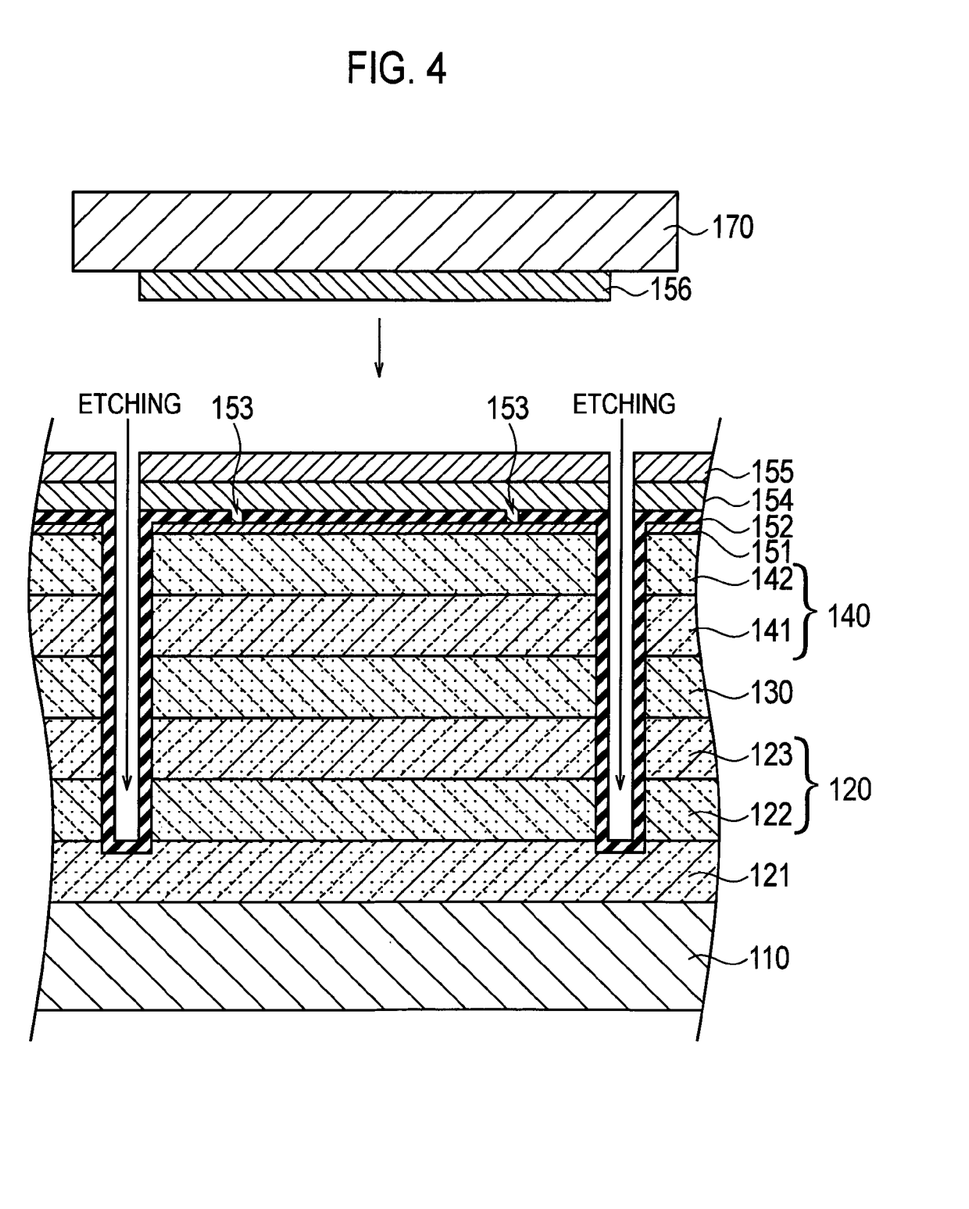
FIG. 4 shows the manufacturing method of a nitride semiconductor light-emitting device according to the embodiment of the present invention.
Figure 5:
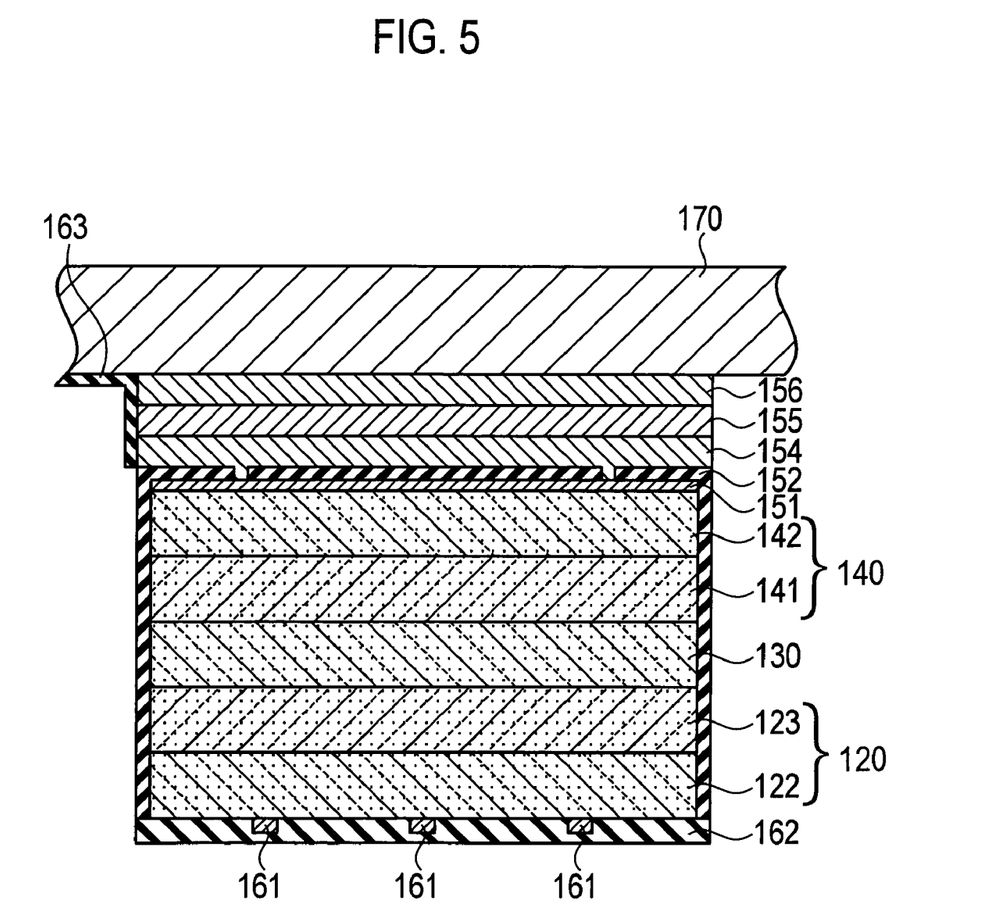
FIG. 5 shows the manufacturing method of a nitride semiconductor light-emitting device according to the embodiment of the present invention.

As shown in FIG. 4, in Step S102, a support substrate joining step is performed in which a support substrate 170 is joined onto the p-type nitride semiconductor layer 140. FIG. 4 illustrates a cross-sectional view of the nitride semiconductor light-emitting device after this support substrate joining step is performed.

To be more specific, in the support substrate joining step, firstly, after a dielectric film made of $SiO_2$ or the like or a mask by using a resist is formed on the first transparent electrode 151, an etching is performed on the first transparent electrode 151 and the nitride semiconductor layer until the n-type buffer layer 121 is exposed via the first transparent electrode 151 by, for example, an ICP (inductively Coupled Plasma) method. Thus, a groove dividing the nitride semiconductor layer into the size of the nitride semiconductor light-emitting device is formed Secondly, by P-CVD (Plasma Chemical Vapor Deposition), spattering or the like, a first insulating film 152 made of SiN or the like is formed on the exposed surfaces such as on the first transparent electrode 151 and on a side surface of the nitride semiconductor layer.

Thirdly, by using a $CF_4$-type gas, a dry-etching is performed on the first insulating film 152 formed on the first transparent electrode 151, thereby forming a first contact hole 153 on the first insulating film 152.

Note that this dry-etching can be performed only on the first insulating film 152, since the etching rate of the first transparent electrode 151 made of ZnO, ITO, and the like is slow. Accordingly, other layers can be protected.

Fourthly, by using a deposition method, an Al layer, a Ti layer, and an Au layer are sequentially laminated on the first transparent electrode 151 exposed via the first contact hole 153, and on the first insulating film 152, thereby forming a reflecting mirror film 154.

Note that another silver-white metal layer such as an Ag layer may be used instead of an Al layer. Further, an alloy layer of Au and Sn may be used instead of an Au layer. Furthermore, an Au layer may be formed on the Al layer without a Ti layer.

Fifthly, on the reflecting mirror film 154, a first joining layer 155 made of an alloy layer of Au and Sn or an Au layer alone is formed.

Sixthly, apart from the above-described steps, a second joining layer 156 made of an alloy layer of Au and Sn or an Au layer alone is formed on the support substrate 170.

In Step S103, a detaching step is performed in which the n-type nitride semiconductor layer 120 is detached from the growth substrate 110. Then, in Step S104, a contact electrode forming step is performed. FIG. 5 illustrates a cross-sectional view of the nitride semiconductor light-emitting device after performing step of forming the contact electrode.

To be more specific, in the detaching step, firstly, an etching is further performed by the ICP method on the groove in which the n-type buffer layer 121 is exposed, until the growth substrate 110 is exposed in a similar manner to the etching firstly performed in the support substrate joining step. Note that the nitride semiconductor layer does not suffer any unnecessary damage by this etching, since the nitride semiconductor layer is protected by the already formed first insulating film 152.

Secondly, a pressure is applied at a temperature of the eutectic point of the first joining layer 155 and the second joining layer 156, on the first joining layer 155 and the second joining layer to joint with each other.

Thirdly, a KrF laser light having a wavelength of approximately 248 nm is irradiated at an irradiation energy of approximately 300 mJ/cm$^{-2}$ to 700 mJ/cm$^{-2}$ from the growth substrate 110 side toward the nitride semiconductor layer. Thereby, the n-type buffer layer 121 in the vicinity of the interface between the growth substrate 110 and the n-type buffer layer 121 is thermally decomposed so that the growth substrate 110 is detached from the nitride semiconductor layer.

The KrF laser light almost completely goes through the growth substrate 110 made of sapphire, and is almost completely absorbed by the n-type buffer layer 121 made of GaN. Accordingly, the temperature in the n-type buffer layer 121 in the vicinity of the interface between the growth substrate 110 and the n-type buffer layer 121 is rapidly increased, and then the n-type buffer layer 121 is thermally decomposed.

Note that an $N_2$ gas generated in the thermal decomposition flows into an air gap in the nitride semiconductor layer and does not apply pressure to the nitride semiconductor layer. Accordingly, the $N_2$ gas does not cause any problems such as generation of cracks in the nitride semiconductor layer.

In Step S104, a contact electrode forming step is performed in which a contact electrode is formed on a surface of the n-type nitride semiconductor layer exposed by the detachment of the growth substrate 110.

To be more specific, in the contact electrode forming step, firstly, an etching using acid, alkaline, or the like is performed on the n-type contact layer 122 so that Ga remaining on the surface of the n-type contact layer 122 is removed. It is preferable to further perform a dry-etching on the n-type contact layer 122 after the etching using alkaline or the like is performed. Thereby ohmic characteristics of the n-type contact layer 122 and the contact electrode 161 are further improved.

Secondly, on the surface of the n-type contact layer 122, a contact electrode 161 to be in ohmic contact with the n-type contact layer 122 is formed by laminating a Ti layer and an Al layer sequentially. Note that the contact electrode 161 may be formed by laminating an Al layer alone without a Ti layer.

Thirdly, a second insulating film 162 made of SiN, $SiO_2$, SiON, $Al_2O_3$, and the like is formed on a surface of the contact electrode 161 and the exposed surface of the n-type contact layer 122, by using P-CVD, spattering or the like. Furthermore, by using P-CVD, spattering or the like, a third insulating film 163 made of SiN, $SiO_2$, SiON, $Al_2O_3$, and the like is formed on a part of a side surface of the layers including the reflecting mirror film 154, the first joining layer 155, and the second joining layer 156, and on a part of the support substrate 170.

In Step S105, a transparent electrode forming step is performed in which a second transparent electrode 165 having an optical transparency is formed on a surface of the contact electrode 161.

To be more specific, in the transparent electrode forming step, firstly, a dry-etching by using a $CF_4$-type gas is performed on the second insulating film 162 formed on the contact electrode 161, thereby forming a second contact hole 164.

Secondly, by using a molecular beam epitaxy method, a second transparent electrode 165 is formed on the contact electrode 161, on a surface of the second insulating film 162, on a surface of the third insulating film 163, and on a side surface of the first insulating film 152. The second transparent electrode 165 is made of Ga-doped ZnO, ITO, and the like having a low resistivity of approximately $2\times10^{-4}$ Ωcm.

In Step S106, a pad electrode forming step is performed in which a first pad electrode 157 and a second pad electrode 166 are formed.

To be more specific, in the pad electrode forming step, firstly, a first pad electrode 157 having a diameter of approximately 100 μm is formed, by laminating a Ti layer and an Al layer sequentially in any region on a surface of the support substrate 170.

Secondly, a second pad electrode 166 having a diameter of approximately 100 μm is formed by laminating a Ti layer and an Al layer sequentially, so that the second pad electrode 166 is formed on a surface of the third insulating film 163 formed on the surface of the support substrate 170, and is joined to the second transparent electrode 165.

Thus, the nitride semiconductor light-emitting device illustrated in FIG. 1 is manufactured.

(Operations and Effects of the Nitride Semiconductor Light-Emitting Device of the Embodiment of the Present Invention)

According to the nitride semiconductor light-emitting device of the present embodiment, the region on which the MQW active layer 130 is projected and the region on which the second pad electrode 166 is projected are not overlapped, on the projection plane S parallel to the main surface of the MQW active layer 130. As a result, light generated in the MQW active layer 130 and emitted from the MQW active layer 130 toward the n-type nitride semiconductor layer 120 can be emitted from the nitride semiconductor light-emitting device without being absorbed by the second pad electrode 166. Therefore, it is possible to obtain a nitride semiconductor light-emitting device capable of improving the light extraction efficiency, compared to a nitride semiconductor light-emitting device having the second pad electrode 166 on the surface of the n-type nitride semiconductor layer 120.

Since the contact electrode 161 is formed on the n-type nitride semiconductor layer 120, the contact electrode 161 can supply the electrons to the n-type nitride semiconductor layer. In other words, the contact electrode 161 can be in ohmic contact with the n-type nitride semiconductor layer 120. Furthermore, even when the contact electrode 161 is formed to have a small area in contact with the n-type contact layer 122 so as to prevent the contact electrode 161 from absorbing light, the contact electrode 161 can supply electrons to the n-type contact layer 122 without causing a problem of voltage depression.

For example, assuming the case that a contact resistance between the contact electrode 161 and the n-type nitride semiconductor layer 120 is $7.42 \times 10^{-5}$ $\Omega \cdot cm$, an electric currents of 20 mA flows, and the contact electrode 161 is made of Al and formed into a circle having a diameter of 100 µm. In this case, the voltage depression is as small as 19 mV. On the other hand, assuming the case that the contact electrode 161 is made of Al and formed into a circle having a diameter of 50 µm, while having the same contact resistance and the electric currents as described above. In this case, the voltage decrease is 76 mV, which is sufficiently small and thus does not reach a several hundred mV voltage change which causes a problem.

On the projection plane, the area of the contact electrode 161 can be made smaller than the area of the second pad electrode 166 joined to the wire. Accordingly, the light extraction efficiency can be improved, compared to the light extraction efficiency of the nitride semiconductor light-emitting device in which the second pad electrode 166 is formed on the n-type nitride semiconductor layer 120.

Since the first insulating film 152 is provided between the second transparent electrode 165 and the side surface 100B of the nitride semiconductor layer 100, the electric currents can be prevented from leaking into the MQW active layer 130 and the p-type nitride semiconductor layer 140.

(Other Modification Examples)

The present invention has been described according the above embodiment; however, it should not be understood that this present invention is limited by descriptions and drawings composing part of this disclosure. According to this disclosure, various alternative embodiments, examples, and operational techniques may be obvious to those skilled in the art.

For example, although a nitride semiconductor light-emitting device having the second transparent electrode 165 on the side surface 100B of the nitride semiconductor layer 100 has been exemplified in the embodiment, the present invention is not limited to this. For example, the electrode on the side surface 100B may be formed by a conducting body made of metal. In other words, it is only necessary that the second transparent electrode 165 on the upper surface 100A of the nitride semiconductor layer 100 and the second pad electrode 166 are electrically connected with each other. However, on the upper surface 100A, the second transparent electrode 165 alone is formed, and no conducting body made of metal or the like is formed. This is because the conducting body made of metal and the like absorb light, while the second transparent electrode 165 does not absorb light, so that the light extraction efficiency of the nitride semiconductor light-emitting device is reduced.

Furthermore, although Cu is used as a conductive metal for the support substrate 170 in the embodiment, the present invention is not limited to this. Accordingly, a support substrate made of a non-conductive material may be used. In such case, the third insulating film 163 does not need to be formed between the second pad electrode 166 and the support substrate 170 for securing the insulation there between. In addition, since the first pad electrode 157 cannot supply electrons to the p-type nitride semiconductor layer 140 through the support substrate 170, the first pad electrode 157 needs to be electrically connected to the second joining layer 156, the first joining layer 155, the reflecting mirror layer 154 and the like. More specifically, the first pad electrode 157 is formed so as to be adjacent to the second joining layer 156.

Furthermore, although the method of manufacturing a light-emitting diode and a semiconductor laser which utilize light emitted from the MQW active layer 130 of the nitride semiconductor layer has been mainly exemplified in the embodiment, the present invention is not limited to this. The present invention is also applicable to a method of manufacturing a light-emitting device in which a phosphor using emission light from such a light-emitting device as an excitation light is used in combination.

Furthermore, although descriptions have been given of growing the nitride semiconductor layer by the crystal growth by using the MOCVD method in the embodiment, the present invention is not limited to this. The nitride semiconductor layer may be formed by the crystal growth by using an HVPE method or a gas-source MBE method. In addition, a crystal structure of the nitride semiconductor layer may be a wurtzite structure or a zinc blende structure. Additionally, the plane direction of the crystal growth is not limited to [0001], and may also be [11-20] or [1-100].

As described above, it is obvious that the present invention includes various embodiments and the like which are not described herein. Therefore, the technical scope of the present invention is only determined by constituent features of the invention according to a scope of claims appropriate for the above descriptions.

INDUSTRIAL APPLICABILITY

According to the present invention, it is possible to provide a nitride semiconductor light-emitting device and the method of manufacturing the same, which can improve the light extracting efficiency of the nitride semiconductor light-emitting device.

The invention claimed is:

1. A nitride semiconductor light-emitting device, comprising:
   a support substrate;
   a nitride semiconductor layer which includes a p-type nitride semiconductor layer formed on the support substrate, an active layer formed on the p-type nitride semiconductor layer, and an n-type nitride semiconductor layer formed on the active layer;
   a contact electrode formed on the n-type nitride semiconductor layer;
   a transparent electrode having an optical transparency and formed on the contact electrode; and
   a pad electrode formed on the support substrate and electrically connected to the transparent electrode, wherein,
   on a projection plane parallel to a main surface of the active layer, a region on which the active layer is projected and a region on which the pad electrode is projected are not overlapped.

2. The nitride semiconductor light-emitting device according to claim 1, wherein, on the projection plane, an area of a region on which the contact electrode is projected is smaller than an area of a region on which the pad electrode is projected.

3. The nitride semiconductor light-emitting device according to claim 2, wherein
the transparent electrode is extendedly formed along a side surface of the nitride semiconductor layer, and
an insulating film is provided between the transparent electrode and the side surface of the nitride semiconductor layer.

4. The nitride semiconductor light-emitting device according to claim 1, wherein
the transparent electrode is extendedly formed along a side surface of the nitride semiconductor layer, and
an insulating film is provided between the transparent electrode and the side surface of the nitride semiconductor layer.

5. A method of manufacturing a nitride semiconductor light-emitting device, comprising:
forming, on a growth substrate, a nitride semiconductor layer made of an n-type nitride semiconductor layer, an active layer, and a p-type nitride semiconductor layer sequentially,
joining a support substrate onto the p-type nitride semiconductor layer,
detaching the n-type nitride semiconductor layer from the growth substrate,
forming a contact electrode on the n-type nitride semiconductor layer exposed by the detachment of the growth substrate;
forming, on the contact electrode, a transparent electrode having an optical transparency; and
forming, on the support substrate, a pad electrode electrically connected to the transparent electrode, wherein
the pad electrode is formed so that a region on which the main surface of the active layer is projected and a region on which the pad electrode is projected are not overlapped, on a projection plane parallel to a main surface of the active layer.

* * * * *